(12) United States Patent
Shinozaki et al.

(10) Patent No.: US 10,170,345 B2
(45) Date of Patent: Jan. 1, 2019

(54) SUBSTRATE PROCESSING APPARATUS

(71) Applicant: Ebara Corporation, Tokyo (JP)

(72) Inventors: Hiroyuki Shinozaki, Tokyo (JP); Yutaka Kobayashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 15/638,611

(22) Filed: Jun. 30, 2017

(65) Prior Publication Data

US 2018/0012780 A1 Jan. 11, 2018

(30) Foreign Application Priority Data

Jul. 6, 2016 (JP) ................... 2016-134552

(51) Int. Cl.
| | |
|---|---|
| *G03D 5/04* | (2006.01) |
| *H01L 21/67* | (2006.01) |
| *B05C 11/08* | (2006.01) |
| *C23C 16/44* | (2006.01) |
| *C23C 16/442* | (2006.01) |
| *G03F 7/30* | (2006.01) |
| *H01L 21/304* | (2006.01) |
| *B24B 37/10* | (2012.01) |
| *B24B 53/017* | (2012.01) |
| *B24B 57/02* | (2006.01) |

(52) U.S. Cl.
CPC ........ *H01L 21/67051* (2013.01); *B05C 11/08* (2013.01); *B24B 37/107* (2013.01); *B24B 53/017* (2013.01); *B24B 57/02* (2013.01); *C23C 16/4401* (2013.01); *C23C 16/442* (2013.01); *G03F 7/3021* (2013.01); *H01L 21/304* (2013.01); *H01L 21/6715* (2013.01); *H01L 21/6719* (2013.01); *H01L 21/67028* (2013.01)

(58) Field of Classification Search
CPC .................................. G03D 5/04; G03D 3/06
See application file for complete search history.

(56) References Cited

U.S. PATENT DOCUMENTS

2016/0268146 A1* 9/2016 Kobayashi .......... H01L 21/6715

FOREIGN PATENT DOCUMENTS

| JP | 3696405 B | 9/2005 |
|---|---|---|
| JP | 2010-050436 A | 3/2010 |
| JP | 5542818 B | 7/2014 |

* cited by examiner

*Primary Examiner* — Minh Q Phan
(74) *Attorney, Agent, or Firm* — Abelman, Frayne & Schwab

(57) ABSTRACT

Disclosed is a substrate processing apparatus that includes: a polishing table; an atomizer configured to spray a fluid to a polishing surface; a polishing liquid supply nozzle configured to drop a slurry at a position that corresponds to a slurry dropping position set on the polishing table and is lower than the top surface of the atomizer; a nozzle moving mechanism configured to move the polishing liquid supply nozzle above the atomizer between the retreat position set outside the polishing table and the slurry dropping position; and a nozzle tip retreating mechanism configured to bring the tip end of the polishing liquid supply nozzle into a retreated position above the top surface of the atomizer when the polishing liquid supply nozzle moves between the slurry dropping position and the retreat position.

6 Claims, 13 Drawing Sheets

SUBSTRATE PROCESSING APPARATUS

CROSS-REFERENCE TO RELATED APPLICATIONS

This application is based on and claims priority from Japanese Patent Application No. 2016-134552, filed on Jul. 6, 2016, with the Japan Patent Office, the disclosure of which is incorporated herein in its entirety by reference.

TECHNICAL FIELD

The present disclosure relates to a substrate processing apparatus.

BACKGROUND

In the related art, substrate processing apparatuses are disclosed in, for example, Japanese Patent Laid-Open Publication No. 2010-050436, Japanese Patent No. 5542818, and Japanese Patent No. 3696405. Such substrate processing apparatuses are chemical mechanical polishing (CMP) apparatuses that flatly polish the surface of a substrate such as, for example, a silicon wafer, and is configured to perform a polishing process by brining the substrate into slide contact with a polishing pad while supplying slurry (polishing liquid) containing abrasive grains such as, for example, silica ($SiO_2$) or ceria ($CeO_2$) to the polishing pad.

The above-described polishing apparatuses include a polishing table (a substrate processing table) having a polishing pad, a top ring configured to hold a substrate, and a polishing liquid supply nozzle (nozzle) configured to supply a slurry (fluid) onto the polishing table. When a substrate is polished using such polishing apparatuses, a substrate is held by the top ring, slurry is supplied from the polishing liquid supply nozzle to the polishing pad, and the substrate is pressed against the surface (polishing surface) of the polishing pad with a predetermined pressure. Here, the polishing table and the top ring are rotated so that the substrate is brought into slide contact with the polishing surface, so that the surface of the substrate is polished into a flat and mirror-finished surface.

SUMMARY

According to an aspect of the present disclosure, a substrate processing apparatus includes: a substrate processing table; a processing device configured to perform a predetermined processing on the substrate processing table; a nozzle configured to drop a fluid at a position that corresponds to a fluid dropping position set on the substrate processing table and is lower than the top surface of the processing device, at; a nozzle moving mechanism configured to move the nozzle above the processing device between a retreat position set outside the substrate processing table and the fluid dropping position; and a nozzle tip retreating mechanism configured to bring a tip end of the nozzle into a retreated state above the top surface of the processing device when the nozzle moves between the fluid dropping position and the retreat position.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
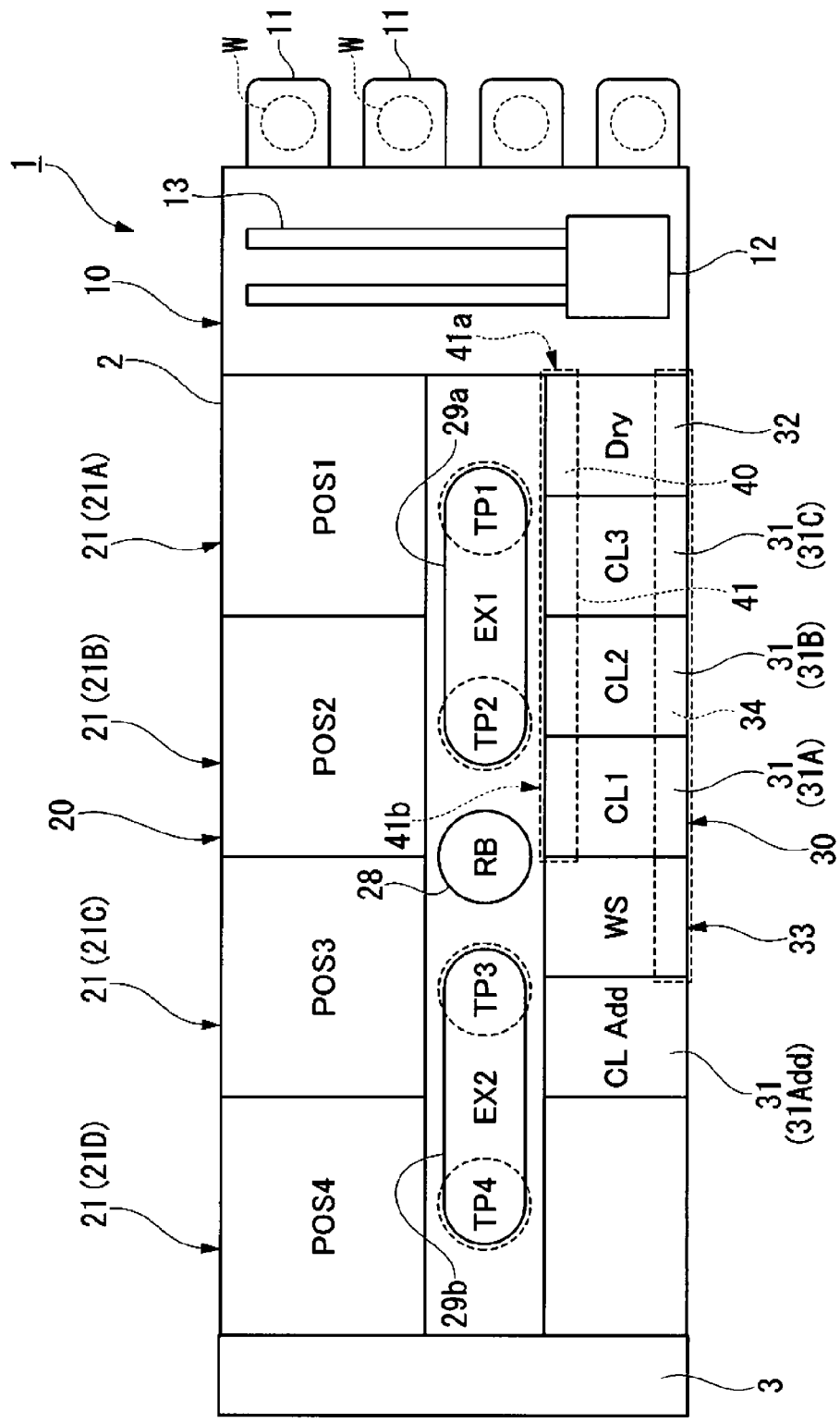
FIG. 1 is a plan view illustrating the overall configuration of a substrate processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the above described polishing apparatuses, the slurry dropped on the polishing table is scattered and adheres to a peripheral device or a wall in some cases. For example, when the slurry adheres to the top ring, which is one of peripheral devices, and the slurry is dried and peels off onto the polishing table, scratching is caused on the surface of the substrate. Accordingly, a function of cleaning the adhering slurry or a cleaning time to wipe off the adhering slurry is required. However, when the adhering slurry is cleaned with, for example, pure water (DIW), the slurry may be diluted by the pure water, thereby affecting the above-described CMP process. When the substrate is held by the top ring, the washed-away slurry may flow around the substrate, thereby contaminating the substrate. Even when the substrate is not held by the top ring, there is a case where the substrate is present in a transfer system below the top ring, and the washed-away slurry may fall on the substrate to contaminate the substrate.

The scattering of the slurry may be caused, for example, when the dropping height of the slurry from the polishing liquid supply nozzle is high. This is because processing devices such as, for example, a dresser configured to dress the polishing surface of the polishing pad, or an atomizer configured to spray a mixed fluid of liquid and gas or a liquid in a mist form to the polishing surface are disposed on the polishing table, and the position of the tip end of the polishing liquid supply nozzle had to be moved up in order to avoid interference with the processing devices. That is, when the tip end of the polishing liquid supply nozzle is lowered, the tip end of the polishing liquid supply nozzle may interfere with the above described processing devices when the polishing liquid supply nozzle is retreated to the outside of the polishing table, for example, in a case where the polishing pad is replaced. Therefore, the tip end of the polishing liquid supply nozzle has conventionally been located above the above described processing devices, and as a result, the slurry has been easily scattered.

The present disclosure has been made in view of the above problems, and an object thereof is to provide a substrate processing apparatus capable of suppressing the scattering of a fluid dropping from a nozzle to a substrate processing table.

According to an aspect of the present disclosure, a substrate processing apparatus includes: a substrate processing table; a processing device configured to perform a predetermined processing on the substrate processing table; a nozzle configured to drop a fluid at a position that corresponds to a fluid dropping position set on the substrate processing table and is lower than a top surface of the processing device; a nozzle moving mechanism configured to move the nozzle above the processing device between a retreat position set outside the substrate processing table and the fluid dropping position; and a nozzle tip retreating mechanism configured to bring a tip end of the nozzle into a retreated state above the top surface of the processing device when the nozzle moves between the fluid dropping position and the retreat position.

In the substrate processing apparatus described above, the nozzle tip retreating mechanism may be disposed outside the substrate processing table.

In the substrate processing apparatus described above, the nozzle may include a main body extending in a horizontal direction from an outside of the substrate processing table, and the tip end bent with respect to the main body, and the nozzle tip retreating mechanism may be a horizontal axis rotating mechanism that rotates the main body around a horizontal axis extending in a longitudinal direction of the main body.

In the substrate processing apparatus described above, the nozzle may include a main body extending in a horizontal direction from an outside of the substrate processing table, and the tip end bent with respect to the main body, and the nozzle tip retreating mechanism may be a horizontal axis rotating mechanism that rotates the main body around a horizontal axis perpendicular to a longitudinal direction of the main body.

In the substrate processing apparatus described above, the horizontal axis rotating mechanism may include an interlocking mechanism that rotates the main body around the horizontal axis using movement of the nozzle by the nozzle moving mechanism.

In the substrate processing apparatus described above, the nozzle tip retreating mechanism may be a lift mechanism that moves up and down the nozzle as a whole.

In the substrate processing apparatus described above, the lift mechanism may be disposed below a top surface of the substrate processing table.

In the substrate processing apparatus described above, the nozzle tip retreating mechanism may be an extension/contraction mechanism that extends and contracts the tip end of the nozzle.

In the substrate processing apparatus described above, the processing device may be an atomizer that sprays the fluid to the substrate processing table.

In the substrate processing apparatus described above, the substrate processing table may include a polishing pad that polishes a substrate.

According to an aspect of the present disclosure, there is provided a substrate processing apparatus capable of suppressing the scattering of a fluid dropping from a nozzle to a substrate processing table.

Hereinafter, a substrate processing apparatus according to an exemplary embodiment of the present disclosure will be described with reference to drawings.

Figure 2:
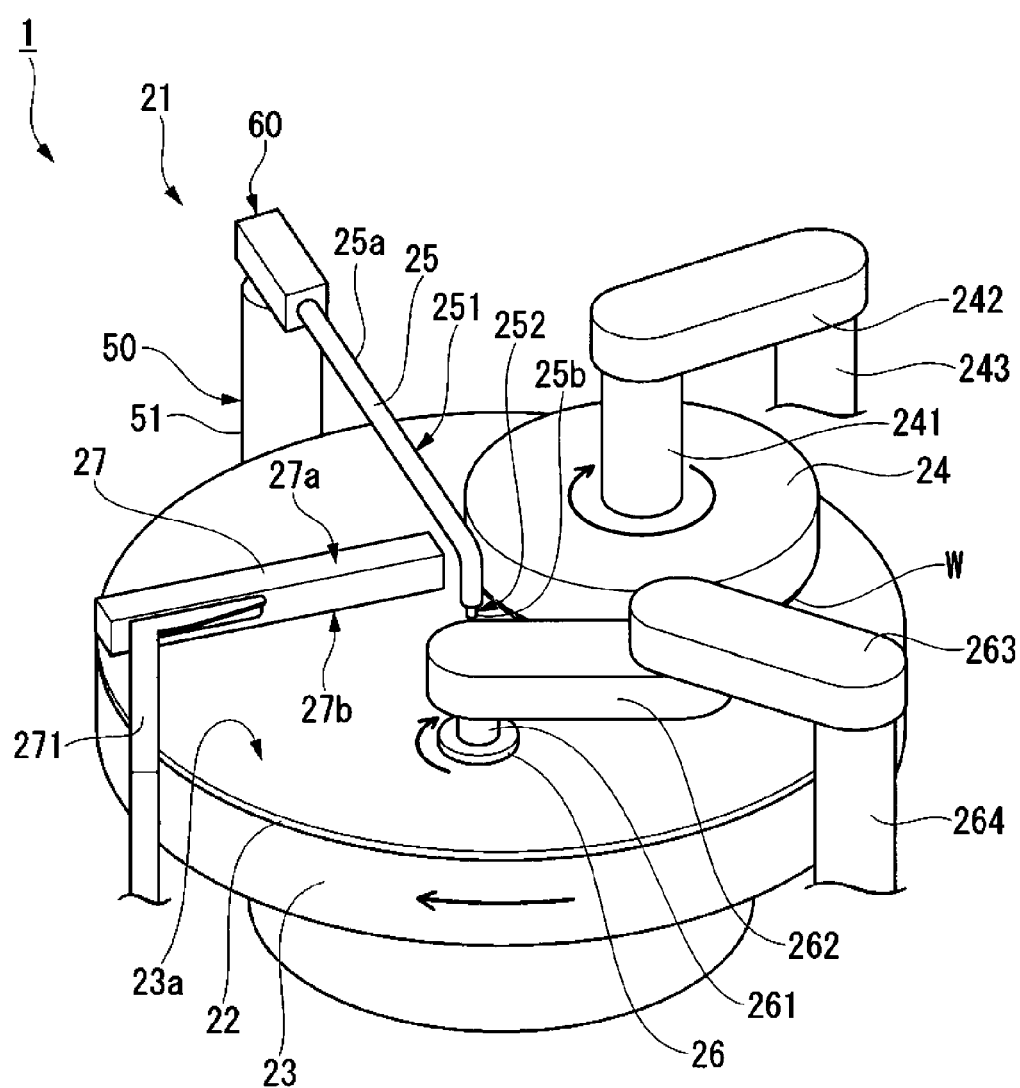
FIG. 2 is a perspective view illustrating the configuration of a polishing module provided in the substrate processing apparatus according to the exemplary embodiment.

FIG. 1 is a plan view illustrating the overall configuration of a substrate processing apparatus 1 according to an exemplary embodiment. FIG. 2 is a perspective view illustrating the configuration of a polishing module 21 provided in the substrate processing apparatus 1 according to the exemplary embodiment.

The substrate processing apparatus 1 is a chemical mechanical polishing (CMP) apparatus that flatly polishes the surface of a substrate W such as, for example, a silicon wafer. As illustrated in FIG. 1, the substrate processing apparatus 1 includes a rectangular box-shaped housing 2. The housing 2 is formed in a substantially rectangular shape in plan view. The interior of the housing 2 is partitioned by partition walls into a loading/unloading section 10, a polishing section 20, and a cleaning section 30. The substrate processing apparatus 1 includes a substrate transfer section 40 that conveys the substrates W from the loading/unloading section 10 to the polishing section 20, and a controller 3 (control panel) that controls the operations of the loading/unloading section 10, the polishing section 20, the cleaning section 30, and the substrate transfer section 40.

The loading/unloading section 10 includes a front loading unit 11 that accommodates the substrates W. A plurality of front loading units 11 are provided at one side surface of the housing 2 in the longitudinal direction. The plurality of front loading units 11 are arranged in the width direction (a direction perpendicular to the longitudinal direction in plan view) of the housing 2. The front loading unit 11 is equipped with, for example, an open cassette, a standard manufacturing interface (SMIF) pod, or a front opening unified pod (FOUP). Each of the SMIF pod and the FOUP is a sealed container that accommodates a substrate W cassette therein and is covered with partition walls, and may maintain an environment independent of the external space.

The loading/unloading section 10 includes a transfer robot 12 that loads and unloads substrates W to/from the front loading units 11, and a traveling mechanism 13 that causes the transfer robot 12 to travel along the arrangement of the front loading units 11. The transfer robot 12 includes two upper and lower hands which are used separately before and after a substrate W is processed. For example, the upper hand is used to return the substrate W to the front loading unit 11, and the lower hand is used to take out an unprocessed substrate W from the front loading unit 11.

The substrate transfer section 40 includes a substrate transfer path 41 that extends in the longitudinal direction of the housing 2. The substrate transfer path 41 passes through a region where the cleaning section 30 is arranged in plan view. One end portion 41a of the substrate transfer path 41 communicates with the loading/unloading section 10, and the other end portion 41b communicates with the polishing section 20. The substrate transfer path 41 is provided with a slide stage that supports the substrates W, and a stage moving mechanism that moves the slide stage between the one end portion 41a and the other end portion 41b. The one end portion 41a is an inlet for the substrates W, is usually closed with a shutter, and is opened when accessed by the transfer robot 12 of the loading/unloading section 10. The other end portion 41b is an outlet of the substrates W, is usually closed with a shutter, and is opened when accessed by a transfer robot 28 of the polishing section 20.

The polishing section 20 includes a plurality of polishing modules 21 (21A, 21B, 21C, and 21D) that polish the substrates W. The plurality of polishing modules 21 are arranged in the longitudinal direction of the housing 2. As illustrated in FIG. 2, each polishing module 21 includes a polishing table 23 having a top surface (a polishing surface 23a) formed by a polishing pad 22, a top ring 24 configured to hold the substrate W and polish the substrate W while pressing the substrate W against the polishing surface 23a, a polishing liquid supply nozzle 25 (nozzle) configured to supply slurry (a polishing liquid) or a dressing liquid (e.g., pure water) onto the polishing table 23, a dresser 26 configured to dress the polishing surface 23a, and an atomizer 27 (a processing device) configured to spray a mixed fluid of a liquid (e.g., pure water) and a gas (e.g., nitrogen gas) or a liquid (e.g., pure water) in a mist form to the polishing surface 23a.

The polishing module 21 presses a substrate W against the polishing surface 23a by the top ring 24 while supplying the slurry from the polishing liquid supply nozzle 25 onto the polishing table 23. The polishing module 21 polishes the substrate W and makes the surface of the substrate W flat while relatively moving the top ring 24 and the polishing table 23. In the dresser 26, hard particles such as, for example, diamond particles or ceramic particles are fixed to a rotating portion at the tip end of the dresser 26 that comes in contact with the polishing surface 23a. The rotating portion rotates and oscillates such that the entire polishing surface 23a is uniformly dressed and formed into a flat polishing surface 23a. The atomizer 27 washes away, for example, the polishing waste or abrasive grains remaining on the polishing surface 23a with a high pressure fluid, thereby achieving the cleaning of the polishing surface 23a, and the dressing operation of the polishing surface by the dresser 26 that is a mechanical contact, that is, the regeneration of the polishing surface 23a.

Referring back to FIG. 1, the polishing section 20 includes the transfer robot 28, a first exchanger 29a, and a second exchanger 29b. In the polishing section 20, a first transfer position TP1, a second transfer position TP2, a third transfer position TP3, and a fourth transfer position TP4 are set in this order from the loading/unloading section 10 side along the arrangement of the plurality of polishing modules 21. The first transfer position TP1, the second transfer position TP2, the third transfer position TP3, and the fourth transfer position TP4 are positions at which substrates W are delivered to and from the polishing module 21A, the polishing module 21B, the polishing module 21C, and the polishing module 21D, respectively. Each of the polishing modules 21 accesses the first transfer position TP1, the second transfer position TP2, the third transfer position TP3, and the fourth transfer position TP4 by the rotation of a support arm 242 (see FIG. 2) of the top ring 24.

The transfer robot 28 delivers the substrates W among the substrate transfer section 40, the first exchanger 29a, and the second exchanger 29b. The transfer robot 28 includes, for example, a hand configured to hold a substrate W, a reversing mechanism configured to invert the hand upside down, an extendable arm configured to support the hand, an arm vertical moving mechanism configured to vertically move the arm, and an arm rotating mechanism configured to rotate the arm around an axis extending in the vertical direction. The transfer robot 28 is movable between the second transfer position TP2 and the third transfer position TP3, and distributes the substrates W received from the substrate transfer section 40, to the first exchanger 29a or the second exchanger 29b. The transfer robot 28 receives the substrates W polished in the polishing module 21 from the first exchanger 29a or the second exchanger 29b and delivers the substrates W to the cleaning section 30.

The first exchanger 29a is a mechanism configured to transfer the substrates W between the first transfer position TP1 and the second transfer position TP2. The first exchanger 29a includes, for example, a plurality of slide stages configured to support substrates W, a stage moving mechanism configured to horizontally move the slide stages at different heights, a first pusher disposed in the first transfer position TP1, and a second pusher disposed in the second transfer position TP2. Each slide stage has a substantially U-shaped notch portion through which the first pusher or the second pusher may vertically pass, and moves between the first transfer position TP1 and the second transfer position TP2 by the stage moving mechanism. The first pusher vertically moves at the first transfer position TP1, and delivers the substrates W between the slide stage and the top ring 24 of the polishing module 21A. The second pusher vertically moves at the second transfer position TP2, and delivers the substrates W between the slide stage and the top ring 24 of the polishing module 21B.

The second exchanger 29b is a mechanism configured to convey substrates W between the third transfer position TP3 and the fourth transfer position TP4. The second exchanger 29b includes, for example, a plurality of slide stages configured to support the substrates W, a stage moving mechanism configured to horizontally move the slide stages at different heights, a third pusher disposed at the third transfer position TP3, and a fourth pusher disposed at the fourth transfer position TP4. Each slide stage has a substantially U-shaped notch portion through which the third pusher or the fourth pusher may vertically pass, and moves between the third transfer position TP3 and the fourth transfer position TP4 by the stage moving mechanism. The third pusher vertically moves at the third transfer position TP3, and delivers the substrates W between the slide stage and the top ring 24 of the polishing module 21C. The fourth pusher vertically moves at the fourth transfer position TP4, and delivers the substrates W between the slide stage and the top ring 24 of the polishing module 21D.

The cleaning section 30 includes a plurality of cleaning modules 31 (31A, 31B, 31C, and 31Add) configured to clean substrates W, and a drying module 32 configured to dry the cleaned substrates W. The plurality of cleaning modules 31 and the drying module 32 are arranged in the longitudinal direction of the housing 2. A transfer chamber 33 (a wafer station) is provided between the cleaning module 31A and the cleaning module 31Add. A stage on which the substrates W delivered from the transfer robot 28 are placed is provided in the transfer chamber 33. The cleaning section 30 includes a cleaning section substrate transfer mechanism 34 that picks up the substrates W placed on the stage in the transfer chamber 33, and transfers the substrates W among the plurality of cleaning modules 31, the drying module 32, and the transfer chamber 33.

The cleaning module 31A is disposed adjacent to the transfer chamber 33, and primarily cleans the substrates W. The cleaning module 31B is disposed adjacent to the cleaning module 31A, and secondarily cleans the substrates W. The cleaning module 31C is disposed adjacent to the cleaning module 31B, and tertiarily cleans the substrates W. The drying module 32 is disposed adjacent to the cleaning module 31C, and performs, for example, Rotagoni drying (Iso-Propyl Alcohol (IPA) drying). The cleaning module 31Add disposed on the opposite side of the cleaning module 31A across the transfer chamber 33 is added according to the specification of cleaning, and preliminarily cleans the substrates W, for example, before the cleaning process of the cleaning modules 31A, 31B, and 31C.

Each cleaning module 31 includes, for example, a roll cleaning module using a roll cleaning member, a pencil cleaning module using a pencil cleaning member, and a two-fluid cleaning module using a two-fluid nozzle. Respective cleaning modules 31 may be the same type of cleaning modules or different types of cleaning modules. Each of the cleaning modules 31 and the drying module 32 includes a shutter-attached opening through which substrates W and the cleaning section substrate transfer mechanism 34 configured to transfer the substrates W may pass. After the drying, the shutter provided in the partition wall between the drying module 32 and the loading/unloading section 10 is opened and the substrates W are taken out from the drying module 32 by the transfer robot 12.

Subsequently, the configuration of the polishing module 21 will be described in detail.

As illustrated in FIG. 2, the polishing module 21 includes a polishing table 23 and a top ring 24 that holds a substrate W (a polishing target) and presses the substrate W against a polishing pad 22 on the polishing table 23. The polishing table 23 is connected to a polishing table rotating motor (not illustrated) disposed below the polishing table 23 via a table shaft, and is configured to rotate around the table shaft.

The polishing pad 22 is attached to the top surface of the polishing table 23, and the surface of the polishing pad 22 forms the polishing surface 23a that polishes the substrate W. For example, SUBA800, IC-1000, or IC-1000/SUBA400 (two-layer cloth) manufactured by Rodel Inc. is used for the polishing pad 22. SUBA800 is a nonwoven fabric obtained by solidifying fibers with urethane resin. IC-1000 is a rigid foamed polyurethane, is a pad having a number of fine holes on the surface thereof, and is also called a perforate pad.

The polishing liquid supply nozzle 25 is provided above the polishing table 23, and a slurry (a polishing liquid) is supplied to the polishing pad 22 on the polishing table 23 by the polishing liquid supply nozzle 25. As the slurry, a functional liquid containing silica ($SiO_2$) or ceria ($CeO_2$) as abrasive grains is used. The rear end of the polishing liquid supply nozzle 25 is supported by a shaft 51, and the polishing liquid supply nozzle 25 is configured to be oscillated around the shaft 51.

The top ring 24 is configured to hold the substrate W on the bottom surface thereof. The top ring 24 is connected to a shaft 241, and the shaft 241 is configured to vertically move with respect to the support arm 242. By the vertical movement of the shaft 241, the top ring 24 is vertically moved and positioned with respect to the support arm 242. The shaft 241 is configured to rotate by the driving of a polishing head rotating motor (not illustrated). The top ring 24 is configured to rotate around the shaft 241 by the rotation of the shaft 241.

The support arm 242 is configured to be turnable about a shaft 243, and the top ring 24 is configured to be movable from a reception position of a substrate W (the first transfer position TP1 to the fourth transfer position TP4 illustrated in FIG. 1) to a position above the polishing table 23 by the turning of the support arm 242. After moved to the position above the polishing table 23, the top ring 24 presses the substrate W held on the bottom surface thereof against the polishing surface 23a. Here, the polishing table 23 and the top ring 24 are individually rotated, and the slurry is supplied onto the polishing pad 22 from the polishing liquid supply nozzle 25 provided above the polishing table 23. In this manner, during the supply of the slurry onto the polishing pad 22, while the substrate W is pressed against the polishing pad 22, the substrate W and the polishing pad 22 are relatively moved to polish, for example, an insulating film or a metal film on the substrate W.

The dresser 26 includes a shaft 261, a dresser arm 262, and a support arm 263. The dresser 26 is connected to the shaft 261, and the shaft 261 is rotatably attached to the tip end of the dresser arm 262. The dresser 26 has a circular dressing surface to which hard particles are fixed through, for example, electrodeposition. As the hard particles, diamond particles, ceramic particles, or the like may be exemplified. A motor (not illustrated) is incorporated in the dresser arm 262, and the dresser 26 is rotated by the motor. The other end of the dresser arm 262 is connected to the support arm 263 to freely oscillate, and the support arm 263 is turnably supported by a shaft 264.

When the polishing surface 23a is dressed, the polishing table 23 is rotated and the dresser 26 is rotated by the motor (not illustrated). Subsequently, the dresser 26 is lowered by a lift mechanism (not illustrated), and the bottom surface of the dresser 26 is brought into sliding contact with the rotating polishing surface 23a. In this state, by making the dresser arm 262 oscillate (swing), the dresser 26 may move to transverse from the outer periphery end of the polishing surface 23a to the central portion. By the oscillating operation, the dresser 26 may dress the polishing surface 23a throughout the entire area including the center of the polishing surface 23a.

The atomizer 27 is disposed above the polishing pad 22, and is disposed to extend in a substantially radial direction of the polishing table 23 in parallel to the polishing surface 23a. The atomizer 27 is fixed to, for example, the housing 2 (see FIG. 1) by a fixing arm 271 that extends to the outside of the polishing table 23. The atomizer 27 includes an injection port 272 (see, e.g., FIG. 4 to be described below) on the bottom surface 27b thereof which faces the polishing surface 23a. A plurality of injection ports 272 are provided at predetermined intervals along the longitudinal direction of the atomizer 27.

The atomizer 27 is connected to a pure water supply line (not illustrated). A control valve is provided in the pure water supply line, and a control signal is input to the corresponding control valve from the controller 3 serving as a CMP controller so as to control the flow rate of pure water injected from the injection ports 272. Accordingly, pure water is sprayed at an optimum flow rate to the polishing surface 23a, and foreign matter (e.g., polishing pad dreg, or sticky abrasive liquid matter) on the polishing surface 23a are removed. When a mixed fluid is injected from the injection ports 272, the atomizer 27 is also connected to a gas source.

Figure 3:
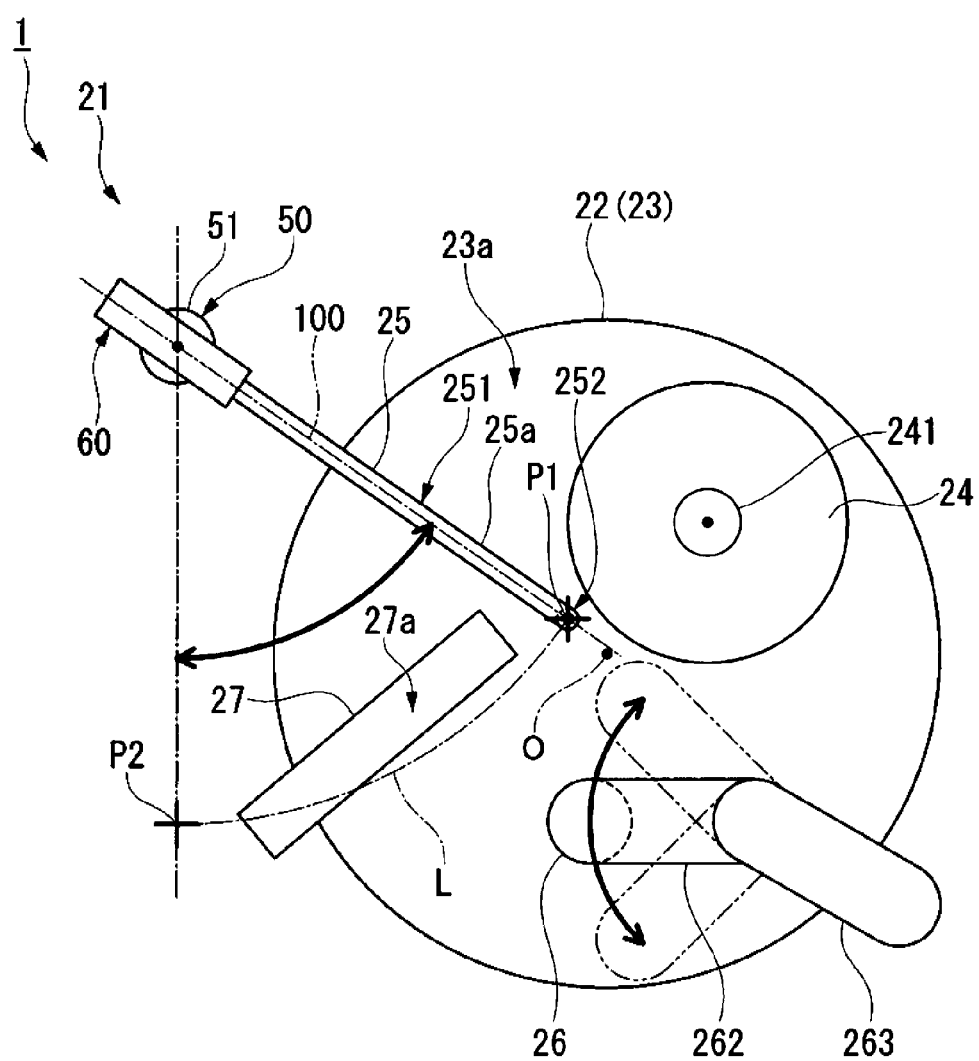
FIG. 3 is a plan view illustrating an arrangement relationship of a polishing liquid supply nozzle, a top ring, a dresser, and an atomizer on a polishing table according to the exemplary embodiment.
Figure 4:
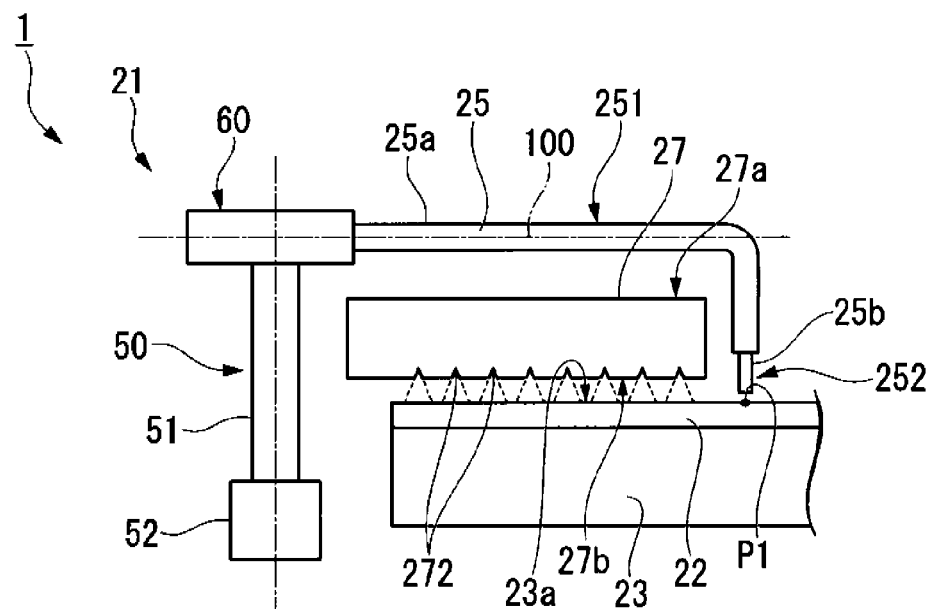
FIG. 4 is a side view illustrating an arrangement relationship between the polishing liquid supply nozzle and the atomizer in the height direction, according to the exemplary embodiment.
Figure 5:
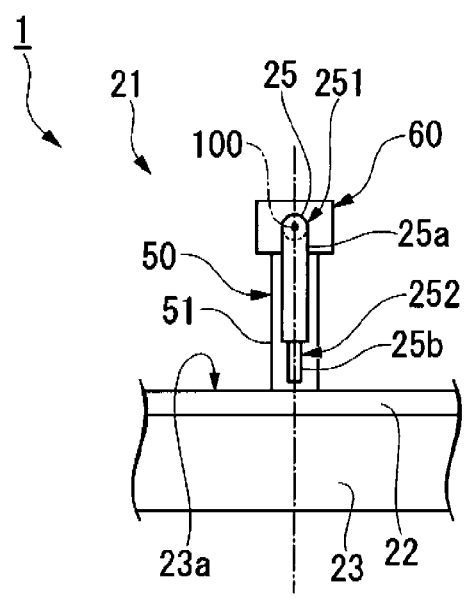
FIG. 5 is a view illustrating the polishing liquid supply nozzle illustrated in FIG. 4 when viewed in a longitudinal direction of the polishing liquid supply nozzle.

FIG. 3 is a plan view illustrating an arrangement relationship of the polishing liquid supply nozzle 25, the top ring 24, the dresser 26, and the atomizer 27 on the polishing table 23 according to the exemplary embodiment. FIG. 4 is a side view illustrating an arrangement relationship between the polishing liquid supply nozzle 25 and the atomizer 27 in the height direction, according to the exemplary embodiment. FIG. 5 is a view illustrating the polishing liquid supply nozzle 25 illustrated in FIG. 4 when viewed in a longitudinal direction of the polishing liquid supply nozzle 25.

As illustrated in FIG. 3, the top ring 24, the dresser 26, and the atomizer 27 are arranged to divide the space above the polishing pad 22 into three in the circumferential direction about the rotation center O of the polishing table 23. The top ring 24 and the atomizer 27 are arranged opposite to each other across the rotation center O of the polishing table 23. The polishing liquid supply nozzle 25 is disposed adjacent to the top ring 24 and the atomizer 27, and the slurry dropping position P1 (fluid dropping position) is set in the vicinity of the rotation center O of the polishing table 23.

The polishing liquid supply nozzle 25 is configured to be freely oscillate about the shaft 51. The shaft 51 constitutes a nozzle moving mechanism 50 that moves the polishing liquid supply nozzle 25 between the retreat position P2 set outside the polishing table 23 and the slurry dropping position P1. The nozzle moving mechanism 50 includes the shaft 51, and a rotation driving unit 52 illustrated in FIG. 4. The rotation driving unit 52 includes a motor that rotates the shaft 51 around the vertical axis outside the polishing table 23. When the shaft 51 is rotated, the polishing liquid supply nozzle 25 oscillates about the shaft 51 as illustrated in FIG. 3. On the oscillating path L of the polishing liquid supply nozzle 25, the atomizer 27 (the processing device) is disposed.

As illustrated in FIG. 4, the polishing liquid supply nozzle 25 includes a main body 251 extending in the horizontal direction from the outside of the polishing table 23, and a tip end 252 bent with respect to the main body 251. The main body 251 extends in the horizontal direction from the upper end of the shaft 51, and is disposed above the top surface 27a of the atomizer 27. The tip end 252 is bent with respect to the main body 251, and is disposed below the top surface 27a of the atomizer 27. That is, the polishing liquid supply nozzle 25 is configured to drop the slurry at a position below the top surface 27a of the atomizer 27 and at the slurry dropping position P1 set on the polishing table 23. The tip end 252 is bent with respect to the main body 251 at a right angle (90°), but may be bent with respect to the main body 251 at, for example, an angle (e.g., 45° or 60°) other than the right angle.

The polishing liquid supply nozzle 25 is connected to a nozzle tip retreating mechanism 60. When the polishing liquid supply nozzle 25 moves between the slurry dropping position P1 and the retreat position P2, the nozzle tip retreating mechanism 60 retreats the tip end 252 of the polishing liquid supply nozzle 25 to a position above the top surface 27a of the atomizer 27. As illustrated in FIGS. 3 and 4, the nozzle tip retreating mechanism 60 is disposed outside the polishing table 23. Specifically, the nozzle tip retreating mechanism 60 is connected to the upper end of the shaft 51 disposed outside the polishing table 23, and is configured to rotate together with the shaft 51.

The nozzle tip retreating mechanism 60 is a horizontal axis rotating mechanism that rotates the main body 251 of the polishing liquid supply nozzle 25 around a horizontal axis 100 extending in the longitudinal direction of the main body 251. The polishing liquid supply nozzle 25 includes a nozzle arm 25a and an inner pipe member 25b. The nozzle arm 25a is formed in a tubular shape, and configured to support the inner pipe member 25b and guide the inner pipe member 25b to the tip end 252 of the polishing liquid supply nozzle 25. The inner pipe member 25b passes through the inside of the nozzle arm 25a to be exposed from the nozzle arm 25a at the tip end 252 of the polishing liquid supply nozzle 25 and to drop the slurry from the tip end thereof. The inner pipe member 25b, except for a portion exposed from the nozzle arm 25a, may be formed of a flexible tube body.

The nozzle arm 25a is connected to the nozzle tip retreating mechanism 60. The nozzle tip retreating mechanism 60 rotates the nozzle arm 25a around the horizontal axis 100 by, for example, a motor (not illustrated), so as to oscillate the tip end 252 of the polishing liquid supply nozzle 25 up and down. In the polishing liquid supply nozzle 25, the inner pipe member 25b, which passes through the inside of the nozzle arm 25a, may follow the oscillation due to the flexibility of the tube body. This eliminates the need for a seal at a sliding portion between the nozzle arm 25a and the nozzle tip retreating mechanism 60. The polishing liquid supply nozzle 25 may have a single pipe structure. In this case, a seal for preventing leakage of the slurry may be provided at a sliding portion between the polishing liquid supply nozzle 25 and the nozzle tip retreating mechanism 60.

Figure 6:
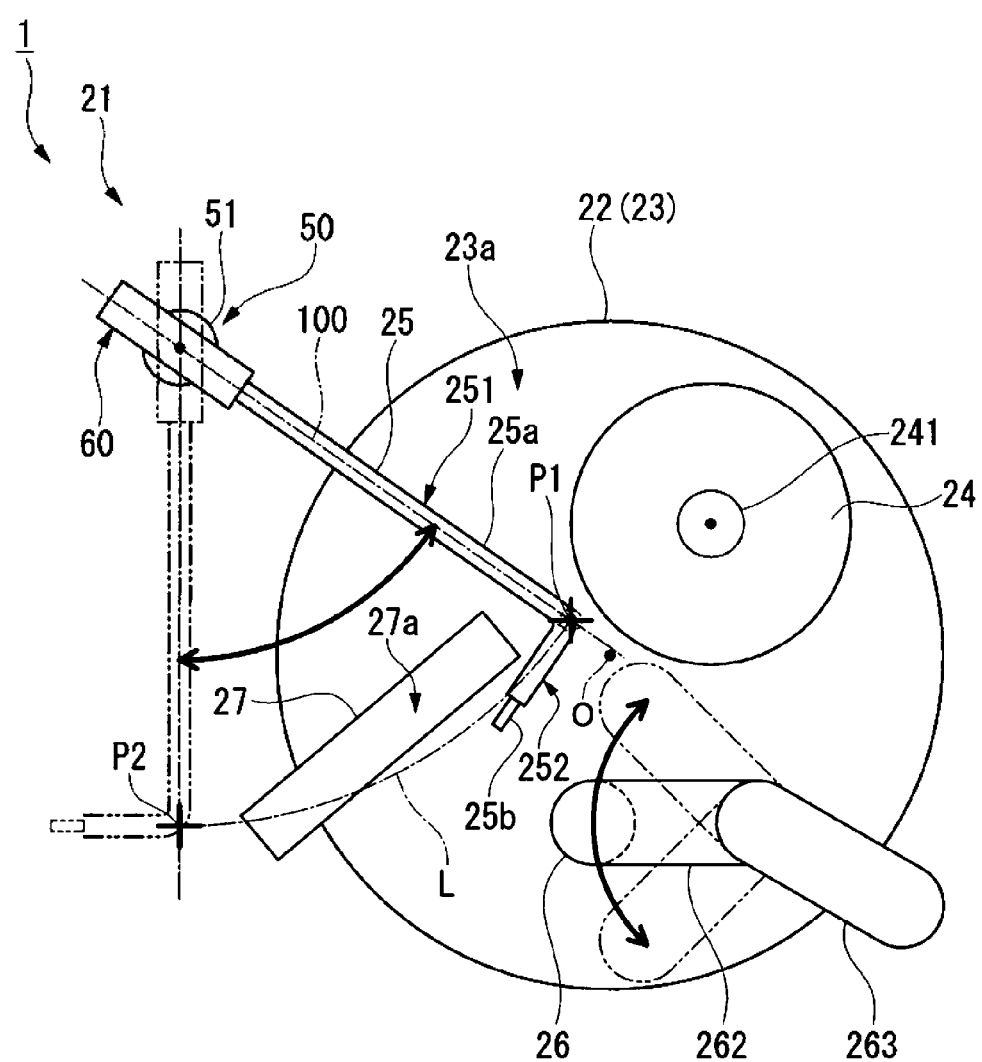
FIG. 6 is a plan view illustrating an aspect of the polishing liquid supply nozzle according to the exemplary embodiment while the polishing liquid supply nozzle moves from a slurry dropping position to a retreat position.
Figure 7:
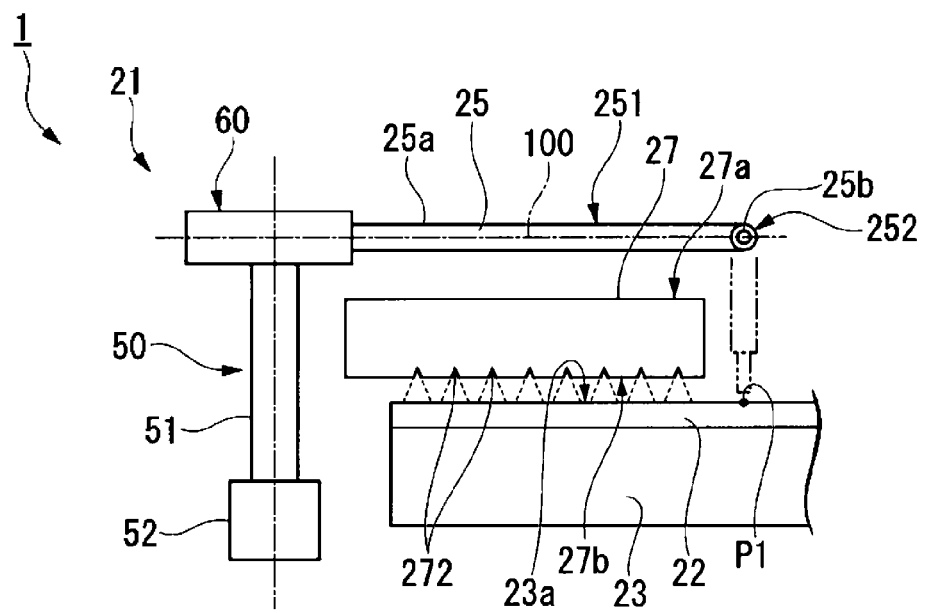
FIG. 7 is a side view illustrating an arrangement relationship between a tip end of the polishing liquid supply nozzle and the atomizer in the height direction when a nozzle tip retreating mechanism according to the exemplary embodiment retreats the tip end of the polishing liquid supply nozzle.
Figure 8:
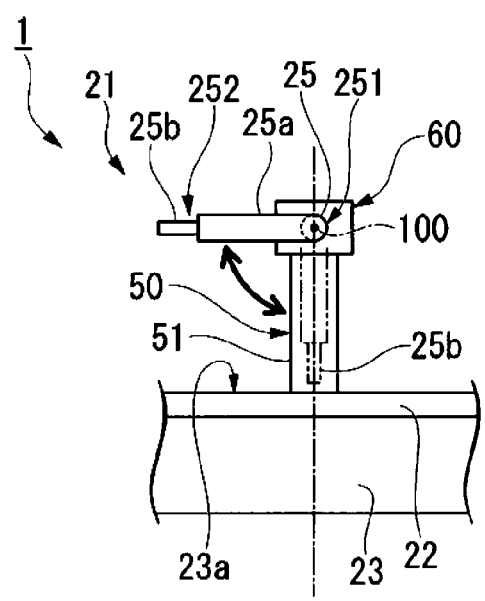
FIG. 8 is a view illustrating the polishing liquid supply nozzle illustrated in FIG. 7 when viewed in a longitudinal direction of the polishing liquid supply nozzle.

FIG. 6 is a plan view illustrating an aspect of the polishing liquid supply nozzle 25 according to the exemplary embodiment while the polishing liquid supply nozzle 25 moves from the slurry dropping position P1 to the retreat position P2. FIG. 7 is a side view illustrating an arrangement relationship between the tip end 252 of the polishing liquid supply nozzle 25 and the atomizer 27 in the height direction when the nozzle tip retreating mechanism 60 according to the exemplary embodiment retreats the tip end 252 of the polishing liquid supply nozzle 25. FIG. 8 is a view illustrating the polishing liquid supply nozzle 25 illustrated in FIG. 7 when viewed in a longitudinal direction of the polishing liquid supply nozzle 25.

As illustrated in FIG. 6, when the polishing liquid supply nozzle 25 moves between the slurry dropping position P1 and the retreat position P2, the nozzle tip retreating mechanism 60 retreats the tip end 252 of the polishing liquid supply nozzle 25 to a position above the top surface 27a of the atomizer 27. Specifically, the nozzle tip retreating mechanism 60 rotates the main body 251 of the polishing liquid supply nozzle 25 around the horizontal axis 100 extending in the longitudinal direction of the main body 251.

The polishing liquid supply nozzle 25 includes a main body 251 extending in the horizontal direction from the outside of the polishing table 23, and a tip end 252 bent with respect to the main body 251. Thus, as illustrated in FIG. 7, the main body 251 is rotated around the horizontal axis 100 extending in the longitudinal direction thereof so as to oscillate the tip end 252 up and down. As illustrated in FIG. 8, the nozzle tip retreating mechanism 60 rotates the tip end 252 of the polishing liquid supply nozzle 25 by 90° from a vertical downward position to a side opposite to the top ring 24, and retreats the tip end 252 to the same height as the main body 251. The main body 251 is disposed above the top surface 27a of the atomizer 27. Thus, as illustrated in FIG. 6, the polishing liquid supply nozzle 25 may move from the slurry dropping position P1 set on the polishing table 23 to the retreat position P2 outside the polishing table 23 by the nozzle moving mechanism 50 while passing above the atomizer 27 without interfering with the atomizer 27. Also, when the polishing liquid supply nozzle 25 moves from the retreat position P2 to the slurry dropping position P1, the tip end 252 is retreated to a position above the top surface 27a of the atomizer 27 by the nozzle tip retreating mechanism 60, thereby avoiding the interference with the atomizer 27.

As described above, in the present exemplary embodiment, due to the nozzle tip retreating mechanism 60, the tip end 252 of the polishing liquid supply nozzle 25 may be retreated to a position above the top surface 27a of the atomizer 27 when the polishing liquid supply nozzle 25 moves between the slurry dropping position P1 and the retreat position P2. Thus, as illustrated in FIG. 4, at the slurry dropping position P1, the tip end 252 may be disposed at a position below the top surface 27a of the atomizer 27, and the dropping height of the slurry from the polishing liquid supply nozzle 25 may be set low. Accordingly, the slurry dropping to the polishing surface 23a from the tip end 252 of the polishing liquid supply nozzle 25 may be suppressed from scattering, and thus may be prevented from adhering to a peripheral device or a wall. As in the present exemplary embodiment, when the nozzle tip retreating mechanism 60 is disposed outside the polishing table 23, it is possible to prevent particles (e.g., abrasion powder or dust) from falling from the movable portion of the nozzle tip retreating mechanism 60 onto the polishing table 23 so as not to affect the CMP process.

Therefore, according to the present exemplary embodiment described above, the substrate processing apparatus 1 capable of suppressing the scattering of the fluid dropping from the polishing liquid supply nozzle 25 to the polishing table 23 is obtained by adopting the configuration which includes: the polishing table 23; the atomizer 27 that sprays a fluid to the polishing surface 23a; the polishing liquid supply nozzle 25 that drops a slurry at a position that corresponds to the slurry dropping position P1 set on the polishing table 23 and is lower than the top surface 27a of the atomizer 27; the nozzle moving mechanism 50 that moves the polishing liquid supply nozzle 25 above the atomizer 27 between the retreat position P2 set outside the polishing table 23 and the slurry dropping position P1; and the nozzle tip retreating mechanism 60 that brings the tip end 252 of the polishing liquid supply nozzle 25 into a retreated position above the top surface 27a of the atomizer 27 when the polishing liquid supply nozzle 25 moves between the slurry dropping position P1 and the retreat position P2.

Modified Example

A modified example of the nozzle tip retreating mechanism 60 will be described with reference to FIGS. 9 to 11. In the following description, the same or equivalent configurations as those in the above described exemplary embodiment are denoted by the same reference numerals, and descriptions thereof will be simplified or omitted.

Figure 9:
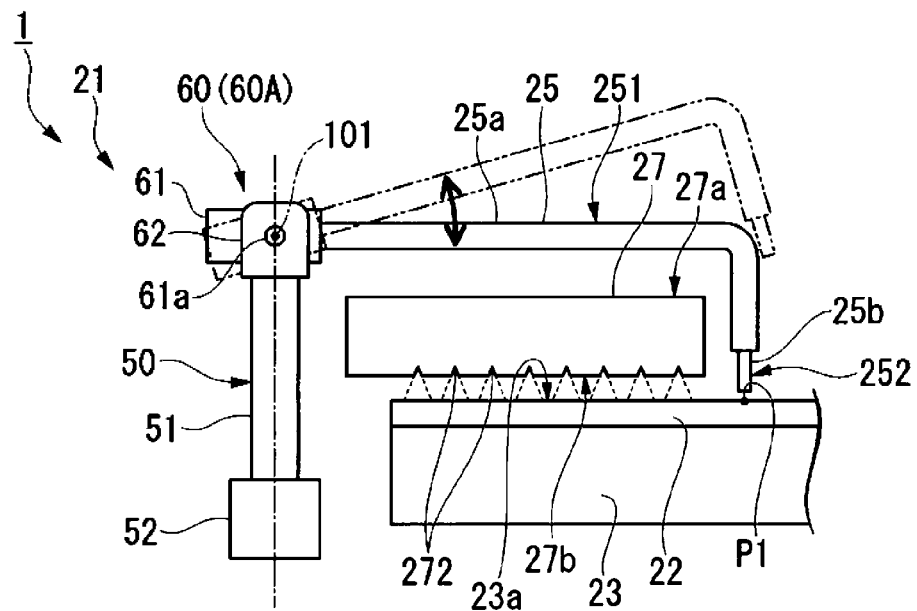
FIG. 9 is a side view illustrating a configuration of a nozzle tip retreating mechanism according to a modified example of the exemplary embodiment.

FIG. 9 is a side view illustrating a configuration of a nozzle tip retreating mechanism 60A according to the modified example of the exemplary embodiment.

The nozzle tip retreating mechanism 60A illustrated in FIG. 9 is a horizontal axis rotating mechanism that rotates the main body 251 of the polishing liquid supply nozzle 25 around a horizontal axis 101 perpendicular to the longitudinal direction of the main body 251. The nozzle tip retreating mechanism 60A includes a movable portion 61 connected to the polishing liquid supply nozzle 25, and a bearing portion 62 that supports the movable portion 61 to be rotatable around the horizontal axis 101. The bearing portion 62 is connected to the upper end of the shaft 51, and supports a rotation shaft 61a of the movable portion 61 to be rotatable around the horizontal axis 101. The movable portion 61 oscillates around the rotation shaft 61a by a driving source such as, for example, an air cylinder (not illustrated), and retreats the tip end 252 of the polishing liquid supply nozzle 25 to a position above the top surface 27a of the atomizer 27. According to this configuration, as in the above described exemplary embodiment, the polishing liquid supply nozzle 25 may move between the slurry dropping position P1 and the retreat position P2 without interfering with the atomizer 27. Since the nozzle tip retreating mechanism 60A may be disposed outside the polishing table 23, it is possible to prevent particles from falling from the movable portion 61 of the nozzle tip retreating mechanism 60A onto the polishing table 23 so as not to affect the CMP process.

Figure 10:
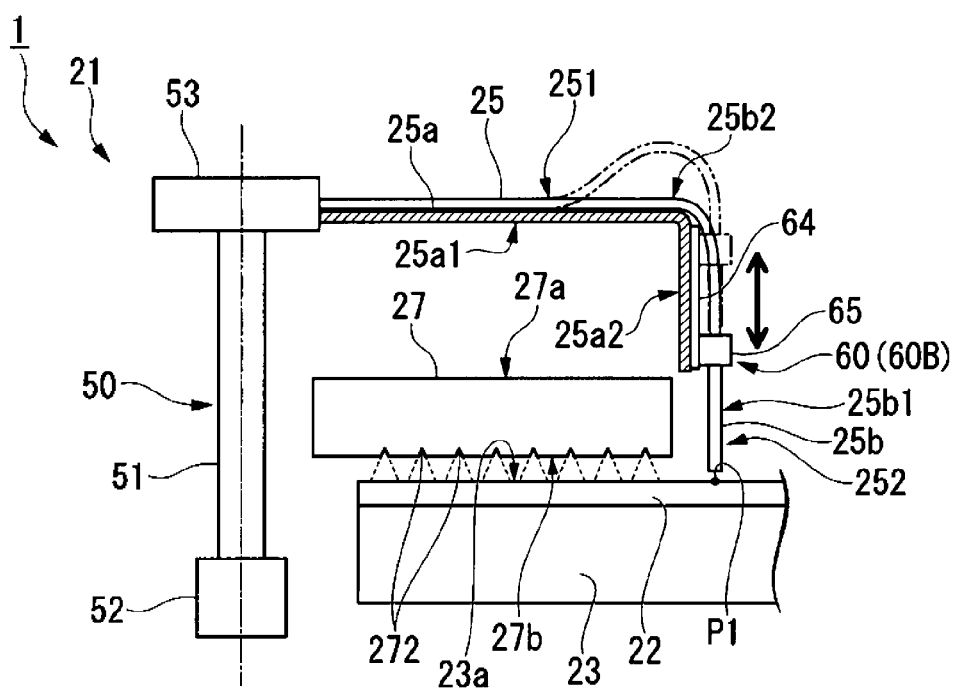
FIG. 10 is a side view illustrating a configuration of a nozzle tip retreating mechanism according to a modified example of the exemplary embodiment.

FIG. 10 is a side view illustrating a configuration of a nozzle tip retreating mechanism 60B according to the modified example of the exemplary embodiment.

The nozzle tip retreating mechanism 60B illustrated in FIG. 10 is an extension/contraction mechanism that extends and contracts the tip end 252 of the polishing liquid supply nozzle 25. The nozzle arm 25a includes a horizontal portion 25a1 extending in the horizontal direction from a fixing portion 53 connected to the upper end of the shaft 51, and a vertical portion 25a2 bent downward from the tip end of the horizontal portion 25a1. The inner pipe member 25b includes a nozzle portion 25b1 that drops the slurry from the tip end thereof, and a flexible tube body 25b2 connected to the nozzle portion 25b1. The nozzle tip retreating mechanism 60B includes a rail 64 hanging down along the vertical portion 25a2, and a slider 65 moving along the rail 64. The slider 65 supports the nozzle portion 25b1 of the inner pipe member 25b, and retreats the tip end 252 of the polishing liquid supply nozzle 25 to a position above the top surface 27a of the atomizer 27. According to this configuration, as in the above described exemplary embodiment, the polishing liquid supply nozzle 25 may move between the slurry dropping position P1 and the retreat position P2 without interfering with the atomizer 27. Since the nozzle tip retreating mechanism 60B is disposed above the polishing table 23, the nozzle tip retreating mechanism 60B may be covered with an elastic cover (e.g., a bellows pipe) so that particles may be prevented from falling from the movable portion of the nozzle tip retreating mechanism 60B onto the polishing table 23.

Figure 11:
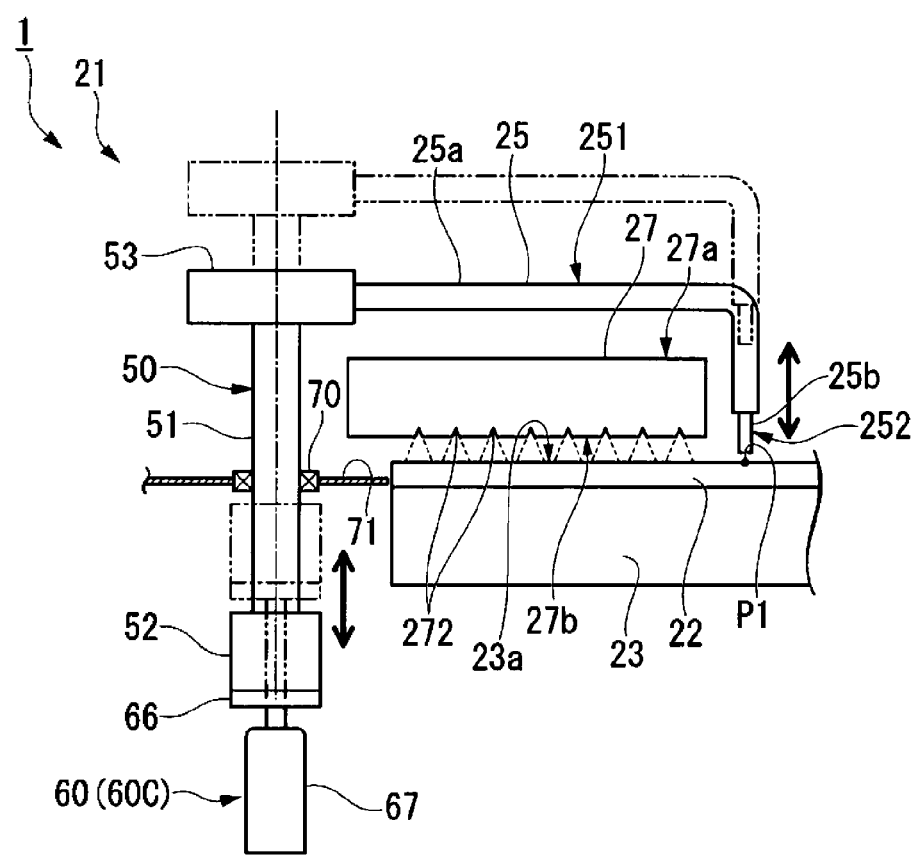
FIG. 11 is a side view illustrating a configuration of a nozzle tip retreating mechanism according to a modified example of the exemplary embodiment.

FIG. 11 is a side view illustrating a configuration of a nozzle tip retreating mechanism 60C according to the modified example of the exemplary embodiment.

The nozzle tip retreating mechanism 60C illustrated in FIG. 11 is a lift mechanism that moves up and down the entire polishing liquid supply nozzle 25. The polishing liquid supply nozzle 25 is moved up and down together with the shaft 51. The outer periphery of the shaft 51 is in sliding contact with a seal member 70. The seal member 70 is attached to a flat-bottom pan 71 that defines a space above the polishing surface 23a (a polishing space) and a space below the polishing surface 23a (a device arrangement space), outside the polishing table 23. The nozzle tip retreating mechanism 60C includes a support base 66 that supports the shaft 51 and the rotation driving unit 52, and an air cylinder 67 that moves up and down the support base 66. The air cylinder 67 moves up and down the entire polishing liquid supply nozzle 25, thereby retreating the tip end 252 to a position above the top surface 27a of the atomizer 27. According to this configuration, as in the above described exemplary embodiment, the polishing liquid supply nozzle 25 may move between the slurry dropping position P1 and the retreat position P2 without interfering with the atomizer 27. Since the nozzle tip retreating mechanism 60C is disposed below the polishing surface 23a (the pan 71) of the polishing table 23, it is possible to securely prevent particles from falling onto the polishing table 23.

Figure 12:
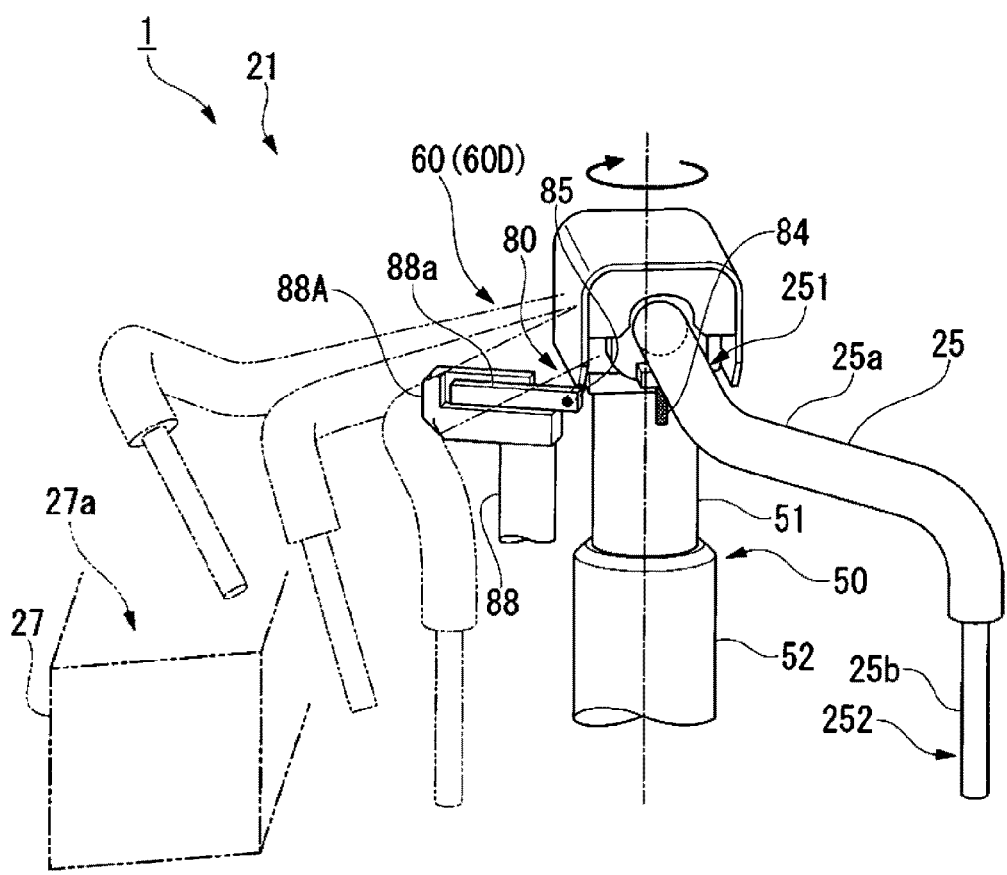
FIG. 12 is a perspective view illustrating the configuration of a nozzle tip retreating mechanism according to a modified example of the exemplary embodiment.
Figure 13:
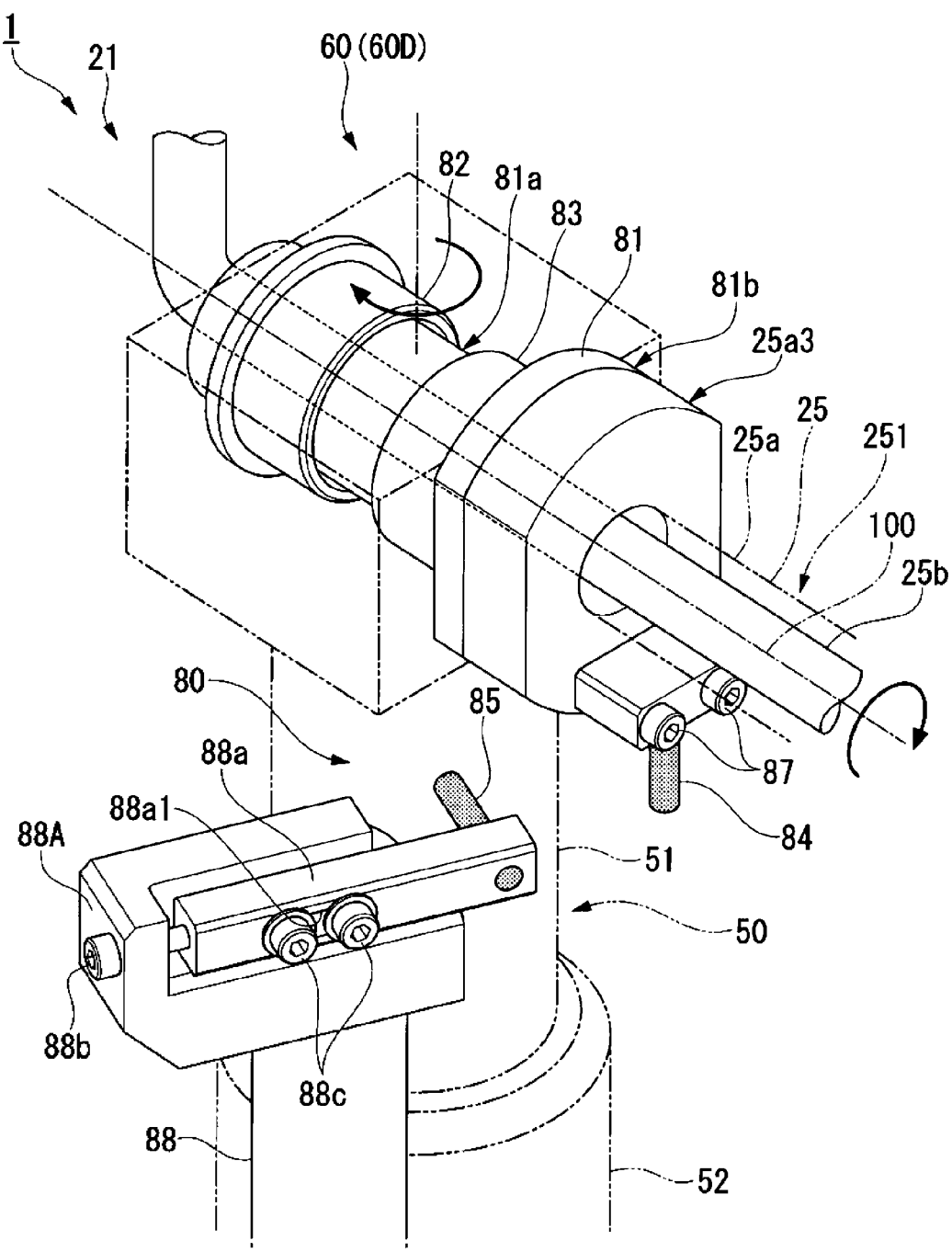
FIG. 13 is a perspective view illustrating the configuration of an interlocking mechanism included in the nozzle tip retreating mechanism illustrated in FIG. 12 in an enlarged scale.
Figure 14:
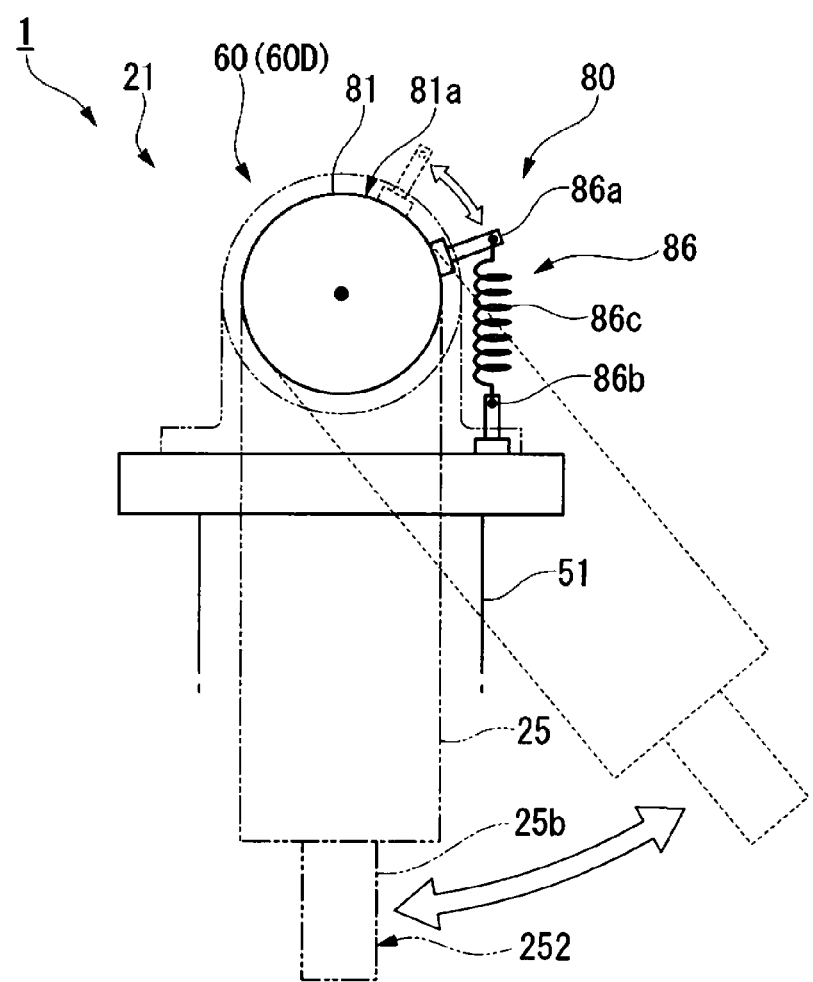
FIG. 14 is a view illustrating an arrangement of a spring mechanism included in the interlocking mechanism illustrated in FIG. 13 when viewed in a longitudinal direction of the polishing liquid supply nozzle.

FIG. 12 is a perspective view illustrating the configuration of a nozzle tip retreating mechanism 60D according to the modified example of the exemplary embodiment. FIG. 13 is a perspective view illustrating the configuration of an interlocking mechanism 80 included in the nozzle tip retreating mechanism 60D illustrated in FIG. 12 in an enlarged scale. FIG. 14 is a view illustrating an arrangement of a spring mechanism 86 included in the interlocking mechanism 80 illustrated in FIG. 13 when viewed in a longitudinal direction of the polishing liquid supply nozzle 25.

The nozzle tip retreating mechanism 60D is a horizontal axis rotating mechanism that rotates the main body 251 of the polishing liquid supply nozzle 25 around the horizontal axis 100 extending in the longitudinal direction of the main body 251, and includes an interlocking mechanism 80 that rotates the main body 251 of the polishing liquid supply nozzle 25 around the horizontal axis 100 using the movement of the polishing liquid supply nozzle 25 by the nozzle moving mechanism 50.

The interlocking mechanism 80 includes a nozzle arm connecting member 81, bearings 82 and 83, a rotation pin 84, and a fixing pin 85 illustrated in FIG. 13, and a spring mechanism 86 illustrated in FIG. 14. As illustrated in FIG. 13, the nozzle arm connecting member 81 includes a body portion 81a formed in a tubular shape, and a flange portion 81b provided at one end of the body portion 81a. The outer periphery of the body portion 81a is supported by the bearings 82 and 83. The flange portion 81b is connected to a root portion 25a3 of the nozzle arm 25a. The bearings 82 and 83 support the main body 251 of the polishing liquid supply nozzle 25 to be rotatable around the horizontal axis 100 through the nozzle arm connecting member 81. The bearings 82 and 83 are fixed to the upper end of the shaft 51.

As illustrated in FIG. 13, the rotation pin 84 is fixed to the root portion 25a3 of the nozzle arm 25a through screw members 87, and is rotatable around the shaft 51 together with the polishing liquid supply nozzle 25. The rotation pin 84 is hanging down from the lower portion of the root portion 25a3 of the nozzle arm 25a. The fixing pin 85 is disposed on a rotation path of the rotation pin 84. The fixing pin 85 is fixed to an upper end 88A of a support column 88 elected from a seating surface (not illustrated). More specifically, the support column 88 includes a support block 88a that supports the fixing pin 85 in the horizontal direction, an adjustment screw 88b that adjusts the position of the support block 88a, and fixing screws 88c that fix the position of the support block 88a. The adjustment screw 88b is screwed to the upper end 88A of the support column 88, and adjusts the position of the fixing pin 85 on the movement path of the rotation pin 84, through the support block 88a. The fixing screws 88c are screwed to the upper end 88A of the support column 88 by being inserted through a long hole 88a1 formed in the support block 88a so as to fix the support block 88a at an arbitrary position.

As illustrated in FIG. 14, the spring mechanism 86 includes a first latching piece 86a fixed to the outer periphery of the body portion 81a of the nozzle arm connecting member 81, a second latching piece 86b fixed to the upper end of the shaft 51, and a spring member 86c having one end latched at the first latching piece 86a and the other end latched at the second latching piece 86b. The spring mechanism 86 applies a biasing force that restores the tip end 252 of the polishing liquid supply nozzle 25 downward. That is, when the tip end 252 of the polishing liquid supply nozzle 25 is directed downward, the spring member 86c may be made to have a natural length (the biasing force is zero). For example, a stopper may be provided such that the tip end 252 of the polishing liquid supply nozzle 25 does not overrun by the biasing force of the spring member 86c.

As illustrated in FIG. 12, according to the interlocking mechanism 80 configured as described above, the main body 251 of the polishing liquid supply nozzle 25 may be rotated around the horizontal axis 100 using the movement of the polishing liquid supply nozzle 25 by the nozzle moving mechanism 50. That is, when the polishing liquid supply nozzle 25 rotates around the shaft 51, the rotation pin 84 comes in contact with the fixing pin 85. Since the nozzle arm 25a to which the rotation pin 84 is fixed is fixed to the nozzle arm connecting member 81 supported to be rotatable around the horizontal axis 100, the main body 251 of the polishing liquid supply nozzle 25 rotates around the horizontal axis 100 when the rotation pin 84 comes in contact with the fixing pin 85. Accordingly, the tip end 252 of the polishing liquid supply nozzle 25 may be moved to a position above the top surface 27a of the atomizer 27. According to the nozzle tip retreating mechanism 60D, the above described driving source (e.g., a motor, or an air cylinder) of the nozzle tip retreating mechanism 60 (the horizontal axis rotating mechanism) illustrated in FIG. 4 may become unnecessary.

Figure 15:
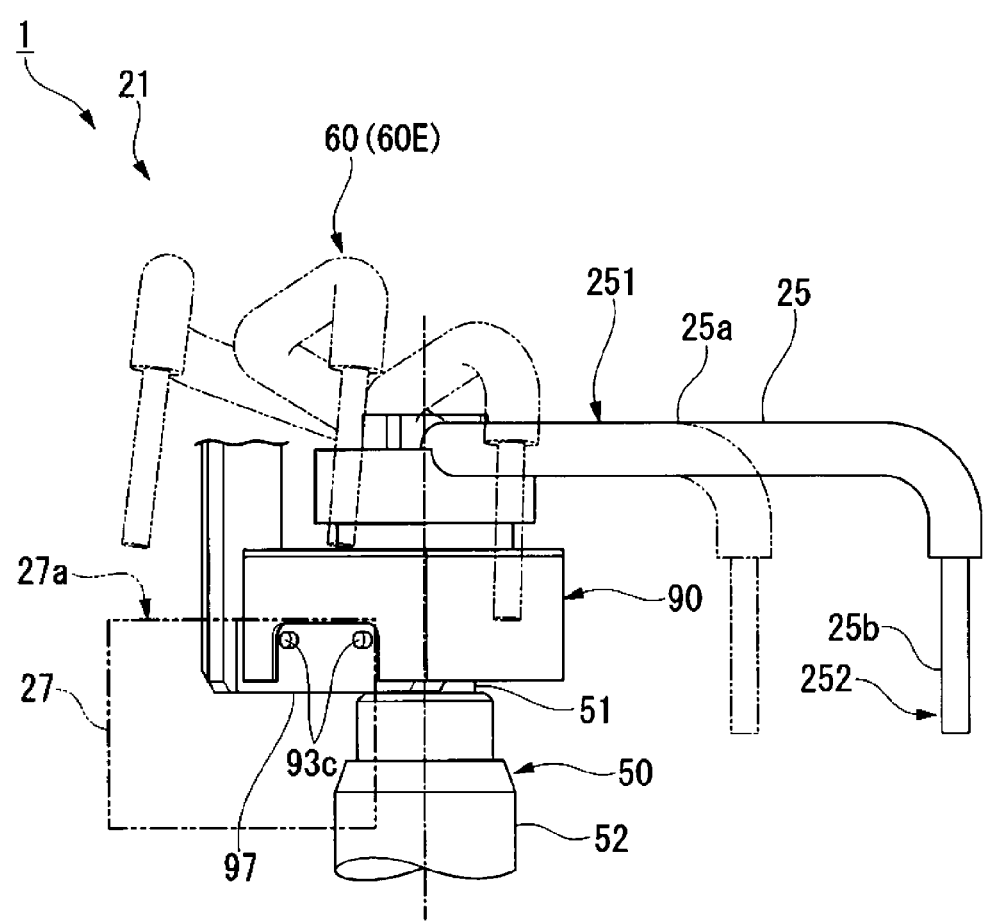
FIG. 15 is a perspective view illustrating the configuration of a nozzle tip retreating mechanism according to a modified example of the exemplary embodiment.
Figure 16:
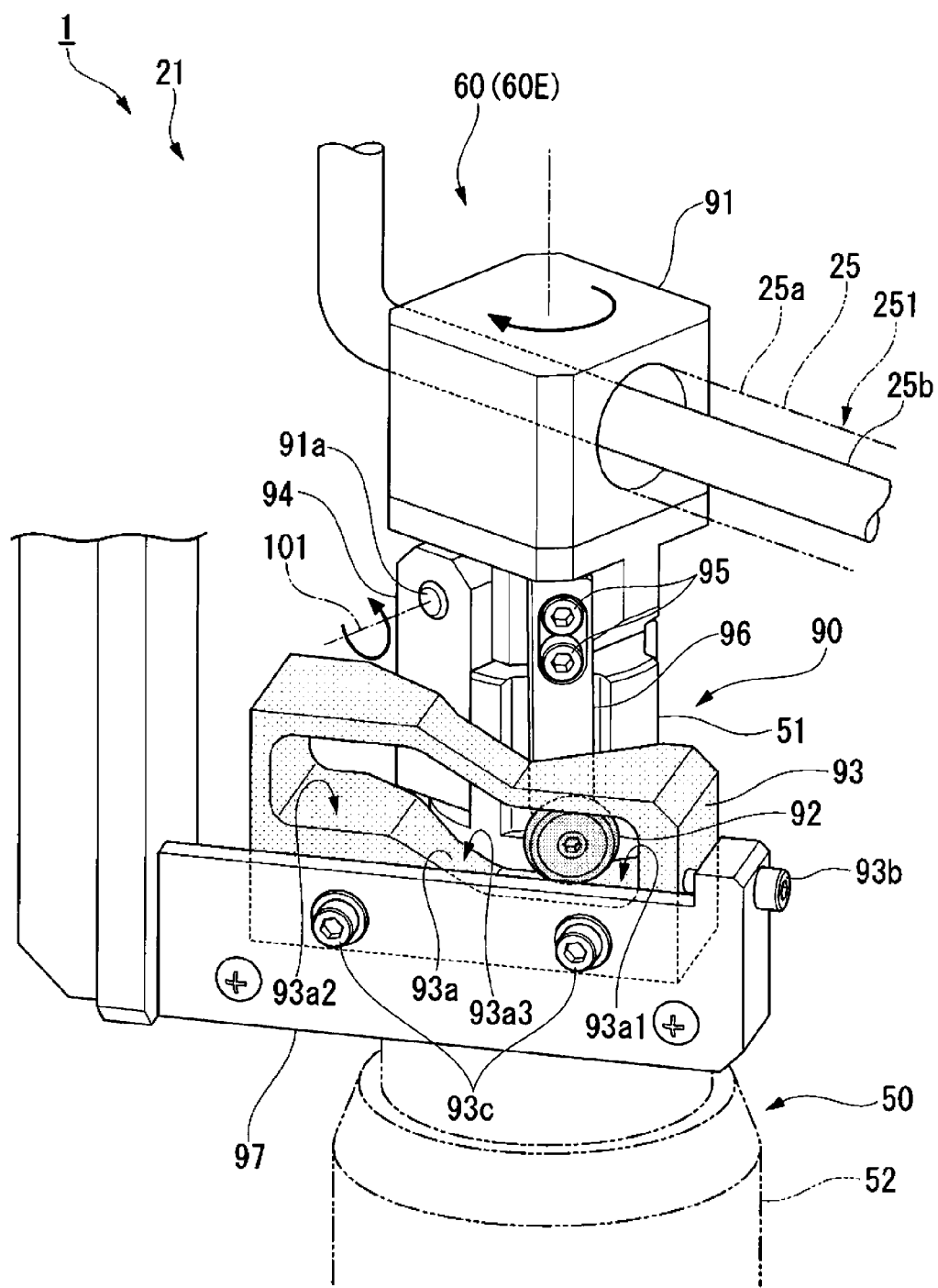
FIG. 16 is a perspective view illustrating the configuration of an interlocking mechanism included in the nozzle tip retreating mechanism illustrated in FIG. 15 in an enlarged scale.

FIG. 15 is a perspective view illustrating the configuration of a nozzle tip retreating mechanism 60E according to the modified example of the exemplary embodiment. FIG. 16 is a perspective view illustrating the configuration of an interlocking mechanism 90 included in the nozzle tip retreating mechanism 60E illustrated in FIG. 15 in an enlarged scale.

The nozzle tip retreating mechanism 60E is a horizontal axis rotating mechanism that rotates the main body 251 of the polishing liquid supply nozzle 25 around the horizontal axis 101 perpendicular to the longitudinal direction of the main body 251, and includes an interlocking mechanism 90 that rotates the main body 251 of the polishing liquid supply nozzle 25 around the horizontal axis 101 using the movement of the polishing liquid supply nozzle 25 by the nozzle moving mechanism 50.

The interlocking mechanism 90 includes a nozzle arm connecting member 91, a cam follower 92, and a guide member 93 illustrated in FIG. 16. The nozzle arm connecting member 91 is connected to the nozzle arm 25a. A rotation shaft 91a is provided below the nozzle arm connecting member 91. The rotation shaft 91a is supported by a bearing member 94 fixed to the upper end of the shaft 51 to be rotatable around the horizontal axis 101. The cam follower 92 is rotatably supported by a fixing piece 96 fixed to the nozzle arm connecting member 91 through screw members 95. The fixing piece 96 is hanging down from the lower portion of the nozzle arm connecting member 91, and supports the cam follower 92 at the lower end thereof.

The guide member 93 is fixed to a support arm 97 hanging down from an upper case (not illustrated). The guide member 93 may be fixed to a support column erected from a seating surface (not illustrated). The guide member 93 includes a rolling groove 93a on which the cam follower 92 rolls when the polishing liquid supply nozzle 25 rotates around the shaft 51. The rolling groove 93a has a first plane 93a1, a second plane 93a2, and an inclined plane 93a3. The first plane 93a1 is provided at a position lower than the second plane 93a2. When the cam follower 92 is present on the first plane 93a1, the tip end 252 of the polishing liquid supply nozzle 25 is located below the top surface 27a of the atomizer 27. That is, when the polishing liquid supply nozzle 25 is positioned at the slurry dropping position P1, the cam follower 92 is in contact with the first plane 93a1.

The second plane 93a2 is provided at a position higher than the first plane 93a1. When the cam follower 92 is present on the second plane 93a2, the tip end 252 of the polishing liquid supply nozzle 25 is located above the top surface 27a of the atomizer 27. That is, when the polishing liquid supply nozzle 25 is positioned at the retreat position P2, the cam follower 92 is in contact with the second plane 93a2. The inclined plane 93a3 is disposed between the first plane 93a1 and the second plane 93a2, and connects the first plane 93a1 to the second plane 93a2. The support arm 97 includes an adjustment screw 93b configured to adjust the position of the guide member 93, and fixing screws 93c configured to fix the position of the guide member 93. The adjustment screw 93b is screwed to the support arm 97, and adjusts the position of the guide member 93 (the rolling groove 93a) on the rotation path of the cam follower 92. The fixing screws 93c are inserted through a long hole (not illustrated) formed in the guide member 93 to fix the guide member 93 at an arbitrary position.

As illustrated in FIG. 15, according to the interlocking mechanism 90 configured as described, the main body 251 of the polishing liquid supply nozzle 25 may be rotated around the horizontal axis 101 using the movement of the polishing liquid supply nozzle 25 by the nozzle moving mechanism 50. That is, when the polishing liquid supply nozzle 25 is rotated around the shaft 51, the cam follower 92 rolls on the rolling groove 93a. The cam follower 92 is connected to the nozzle arm connecting member 91 through the fixing piece 96, and the nozzle arm connecting member 91 is supported by the shaft 51 through the rotation shaft 91a to be rotatable around the horizontal axis 101. Thus, when the cam follower 92 moves from the first plane 93a1 to the second plane 93a2 through the inclined plane 93a3, the main body 251 of the polishing liquid supply nozzle 25 is rotated around the horizontal axis 101. Accordingly, the tip end 252 of the polishing liquid supply nozzle 25 may be moved to a position above the top surface 27a of the atomizer 27. According to the nozzle tip retreating mechanism 60E, the above-described driving source (e.g., a motor, or an air cylinder) of the nozzle tip retreating mechanism 60A (the horizontal axis rotating mechanism) illustrated in FIG. 9 may become unnecessary.

For example, in the above described exemplary embodiment, the atomizer 27 is exemplified as a processing device that interferes with the oscillation of the polishing liquid supply nozzle 25. However, when, for example, the dresser 26 is disposed on the oscillating path L of the polishing liquid supply nozzle 25, the tip end 252 of the polishing liquid supply nozzle 25 may be retreated to a position above the top surface of the dresser 26.

For example, in the above described exemplary embodiment, a configuration where the present disclosure is employed in the polishing module 21 of the substrate processing apparatus 1 has been exemplified. However, for example, the present disclosure may be employed in the cleaning module 31 of the substrate processing apparatus 1. In the cleaning module 31 as well, when a nozzle configured to supply a cleaning liquid to a substrate W is disposed, and, for example, an ultrasonic cleaning device (a processing device) configured to ultrasonically clean the substrate W is disposed, the present disclosure may be employed so that the ultrasonic cleaning device may avoid the interference with the nozzle. When the cleaning module 31 is a roll cleaning module or a pencil cleaning module, the present disclosure may be employed so that a roll cleaning member or a pencil cleaning member may avoid the interference with the nozzle. The present disclosure may also be employed in a substrate processing apparatus (e.g., a back surface polishing apparatus, a bevel polishing apparatus, an etching apparatus, or a plating apparatus) other than the CMP apparatus.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
   a substrate processing table;
   a processing device configured to perform a predetermined processing on the substrate processing table;
   a nozzle configured to drop a fluid at a position that corresponds to a fluid dropping position set on the substrate processing table and is lower than a top surface of the processing device;
   a nozzle moving mechanism configured to move the nozzle above the processing device between a retreat position set outside the substrate processing table and the fluid dropping position; and
   a nozzle tip retreating mechanism configured to bring a tip end of the nozzle into a retreated state above the top surface of the processing device when the nozzle moves between the fluid dropping position and the retreat position,
   wherein the nozzle tip retreating mechanism is an extension/contraction mechanism that extends and contracts the tip end of the nozzle.

2. The substrate processing apparatus of claim 1, wherein the processing device is an atomizer that sprays the fluid to the substrate processing table.

3. The substrate processing apparatus of claim 1, wherein the substrate processing table includes a polishing pad that polishes a substrate.

4. A substrate processing apparatus comprising:
a substrate processing table;
a processing device configured to perform a predetermined processing on the substrate processing table;
a nozzle configured to drop a fluid at a position that corresponds to a fluid dropping position set on the substrate processing table and is lower than a top surface of the processing device;
a nozzle moving mechanism configured to move the nozzle above the processing device between a retreat position set outside the substrate processing table and the fluid dropping position; and
a nozzle tip retreating mechanism configured to bring a tip end of the nozzle into a retreated state above the top surface of the processing device when the nozzle moves between the fluid dropping position and the retreat position,
wherein the nozzle tip retreating mechanism is disposed outside the substrate processing table,
the nozzle includes a main body extending in a horizontal direction from an outside of the substrate processing table, and the tip end bent with respect to the main body, and
the nozzle tip retreating mechanism is a horizontal axis rotating mechanism that rotates the main body around a horizontal axis extending in a longitudinal direction of the main body.

5. The substrate processing apparatus of claim 4, wherein the horizontal axis rotating mechanism includes an interlocking mechanism that rotates the main body around the horizontal axis using a movement of the nozzle which is generated by the nozzle moving mechanism.

6. A substrate processing apparatus comprising:
a substrate processing table;
a processing device configured to perform a predetermined processing on the substrate processing table;
a nozzle configured to drop a fluid at a position that corresponds to a fluid dropping position set on the substrate processing table and is lower than a top surface of the processing device;
a nozzle moving mechanism configured to move the nozzle above the processing device between a retreat position set outside the substrate processing table and the fluid dropping position; and
a nozzle tip retreating mechanism configured to bring a tip end of the nozzle into a retreated state above the top surface of the processing device when the nozzle moves between the fluid dropping position and the retreat position,
wherein the nozzle tip retreating mechanism is disposed outside the substrate processing table,
the nozzle includes a main body extending in a horizontal direction from an outside of the substrate processing table, and the tip end bent with respect to the main body, and
the nozzle tip retreating mechanism is a horizontal axis rotating mechanism that rotates the main body around a horizontal axis perpendicular to a longitudinal direction of the main body.

\* \* \* \* \*